(12) United States Patent
Wiatr et al.

(10) Patent No.: US 8,334,573 B2
(45) Date of Patent: Dec. 18, 2012

(54) BURIED ETCH STOP LAYER IN TRENCH ISOLATION STRUCTURES FOR SUPERIOR SURFACE PLANARITY IN DENSELY PACKED SEMICONDUCTOR DEVICES

(75) Inventors: Maciej Wiatr, Dresden (DE); Markus Forsberg, Dresden (DE); Stephan Kronholz, Dresden (DE); Roman Boschke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 92 days.

(21) Appl. No.: 12/858,727

(22) Filed: Aug. 18, 2010

(65) Prior Publication Data

US 2011/0049637 A1    Mar. 3, 2011

(30) Foreign Application Priority Data

Aug. 31, 2009  (DE) .......................... 10 2009 039 522

(51) Int. Cl.
*H01L 27/088*    (2006.01)

(52) U.S. Cl. ... 257/368; 257/327; 257/510; 257/E21.54; 257/E29.001; 257/E27.06; 257/E21.619

(58) Field of Classification Search ................... 257/368, 257/327, 510, E21.54, E29.001, E27.06, 257/E21.619
See application file for complete search history.

(56) References Cited

U.S. PATENT DOCUMENTS

| 5,923,992 A * | 7/1999 | Spikes et al. | 438/424 |
| 2008/0166841 A1 | 7/2008 | Hsieh | 438/229 |
| 2008/0268598 A1 | 10/2008 | Choi et al. | 438/294 |

FOREIGN PATENT DOCUMENTS

KR    1020050119412 A    12/2005

OTHER PUBLICATIONS

Translation of Official Communication from German Patent Office for German Patent Application No. 10 2009 039 522.9-33 dated Jun. 4, 2010.

* cited by examiner

*Primary Examiner* — Long Pham
(74) *Attorney, Agent, or Firm* — Williams, Morgan & Amerson, P.C.

(57) ABSTRACT

Material erosion of trench isolation structures in advanced semiconductor devices may be reduced by incorporating an appropriate mask layer stack in an early manufacturing stage. For example, a silicon nitride material may be incorporated as a buried etch stop layer prior to a sequence for patterning active regions and forming a strain-inducing semiconductor alloy therein, wherein, in particular, the corresponding cleaning process prior to the selective epitaxial growth process has been identified as a major source for causing deposition-related irregularities upon depositing the interlayer dielectric material.

16 Claims, 12 Drawing Sheets

BURIED ETCH STOP LAYER IN TRENCH ISOLATION STRUCTURES FOR SUPERIOR SURFACE PLANARITY IN DENSELY PACKED SEMICONDUCTOR DEVICES

BACKGROUND OF THE INVENTION

1. Field of the Invention

Generally, the present disclosure relates to the field of integrated circuits, and, more particularly, to circuit elements, such as field effect transistors, and manufacturing techniques in which sophisticated surface topographies lead to deposition-related yield losses in the contact level of semiconductor devices.

2. Description of the Related Art

Integrated circuits typically include a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips, graphic devices and the like, MOS technology is currently one of the most promising approaches due to the superior characteristics in view of operating speed and/or power consumption and/or cost efficiency. During the fabrication of complex integrated circuits using MOS technology, millions of transistors, i.e., N-channel transistors and/or P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially determines the performance of MOS transistors. Thus, the reduction of the channel length, and associated therewith the reduction of the channel resistivity, may be a dominant design criterion for accomplishing an increase in the operating speed of the integrated circuits.

On the other hand, the continuous shrinkage of the gate length of planar transistor configurations may typically result in very sophisticated topographical configurations since the gate height may not be proportionally reduced in relation to the gate length unless very complicated process strategies are used for maintaining the desired overall gate conductivity and the ion blocking effect during the formation of drain and source regions of the transistors in which the gate electrode, in combination with a spacer structure, typically acts as an implantation mask. Consequently, upon further reducing the gate length in order to improve performance of the individual transistors and also increase overall packing density of the semiconductor devices, the space between neighboring gate electrode structures may also be reduced, thereby requiring sophisticated deposition techniques in an advanced manufacturing stage in order to reliably fill the space between the densely packed gate electrode lines. In advanced approaches, the reliable filling in of dielectric material between closely spaced gate electrode lines may, however, strongly depend on the overall manufacturing strategy, in particular when additional performance enhancing mechanisms are implemented in one or both type of transistors. For example, for a given gate length of field effect transistors, the performance thereof may be further increased by inducing a certain type of strain in the channel region of the transistors, which may have a strong effect on the resulting charge carrier mobility. For a standard crystallographic configuration, a compressive strain component in the channel region of P-channel transistors may significantly enhance the overall drive current capability due to an increase of the mobility of holes, which represent the dominant charge carrier in P-channel transistors. Similarly, a tensile strain component in N-channel transistors may result in a significant increase of electron mobility, thereby also improving the drive current capability. One efficient mechanism for increasing the strain locally in P-channel transistors is the incorporation of a strain-inducing semiconductor alloy, such as a silicon/germanium alloy, which may result in a significant compressive strain component. For this purpose, cavities may be selectively formed in the active regions of the P-channel transistors after the patterning of the basic gate electrode structures, and the cavities may be refilled with a crystalline silicon/germanium alloy, which may be grown on the remaining silicon base material, thereby obtaining the desired compressive strained state. Although these techniques provide a significant performance gain of P-channel transistors, it turns out that the incorporation of a strain-inducing semiconductor alloy in a very early manufacturing stage of the transistor element may further contribute to a very pronounced surface topography in depositing an interlayer dielectric material, in particular in isolation structures delineating the active regions of P-channel transistors, as will be explained in more detail with reference to FIGS. 1a-1m.

FIG. 1a schematically illustrates a cross-sectional view of a semiconductor device 100, which comprises a substrate 101 in combination with a semiconductor layer 102, which may typically represent a silicon-based semiconductor material. The substrate 101 and the semiconductor layer 102 may represent a bulk configuration, i.e., the layer 102 may represent a portion of a crystalline semiconductor material of the substrate 101, while, in other cases, a buried insulating layer (not shown) may be formed between the semiconductor layer 102 and the substrate 101, thereby forming a silicon-on-insulator (SOI) configuration. Furthermore, dielectric layers 103 and 104 are provided above the semiconductor layer 102, wherein the layer 103 may typically be provided in the form of a silicon dioxide layer, while the layer 104 may be a silicon nitride layer. It is well known that silicon nitride may be efficiently removed selectively to silicon dioxide material on the basis of a plurality of etch recipes, while silicon dioxide may be removed selectively with respect to silicon material by etch chemistries such as hydrofluoric acid (HF) and the like. Thus, the layers 103 and 104 may be efficiently used for patterning the semiconductor layer 102 in order to form trench isolations therein. For this purpose, an etch mask 105, such as a resist mask and the like, is formed above the layer 104 and comprises an appropriate opening 105A in order to define the lateral position and size of a trench to be formed in the semiconductor layer 102.

The device 100 as illustrated in FIG. 1a may be formed on the basis of well-established process strategies, i.e., the layer 103 may be deposited or may be formed by oxidation, followed by the deposition of the silicon nitride material 104, which may be accomplished by using thermally activated chemical vapor deposition (CVD) recipes, plasma enhanced CVD and the like. Thereafter, the etch mask 105 may be provided, for instance, on the basis of advanced lithography techniques. Thereafter, well-established etch techniques may be applied in order to etch through the layers 104 and 105 and thereafter selecting an appropriate anisotropic etch chemistry for etching into the semiconductor layer 102 on the basis of the etch mask 105 and/or the patterned layers 103 and 104.

FIG. 1b schematically illustrates the device 100 with a trench 102T formed in the semiconductor layer 102 and in the layers 103 and 104. It should be appreciated that the trench 102T may thus laterally delineate corresponding semiconductor regions of the layer 102, wherein, for instance, a first active region 102A may be laterally separated from a second active region 102B. In this respect, an active region is to be understood as a portion of the semiconductor layer 102 in which PN junctions of one or more transistor elements are to be formed in a later manufacturing stage. It should be appreciated that the isolation trench 102T may extend down to a buried insulating layer if an SOI configuration is considered.

FIG. 1c schematically illustrates the device 100 in a manufacturing stage in which a fill material 105, such as a silicon dioxide material, is provided so as to reliably fill the trench 102T, which may be accomplished on the basis of well-established CVD techniques. It should be appreciated that, if required, additional process steps, such as an oxidation step and the like, may be performed in order to obtain a certain degree of corner rounding and the like, if required.

FIG. 1d schematically illustrates the device 100 after the removal of any excess material of the layer 105 (FIG. 1c) which may be accomplished on the basis of chemical mechanical polishing (CMP), thereby forming a trench isolation structure 120. During the removal process, the silicon nitride layer 104 may act as an efficient stop material. Thereafter, depending on the degree of over-polish applied during the preceding removal process, the layer 104 may be removed by a further CMP process and/or an etch process, wherein undue exposure of the active regions 102A, 102B may be prevented on the basis of the silicon dioxide layer 103. Next, the layer 103 may be removed, for instance, by any appropriate wet chemical etch recipe, thereby also removing a portion of the trench isolation structure 120.

FIG. 1e schematically illustrates the semiconductor device 100 after the above-described process sequence, wherein the trench isolation structure 120 may have substantially the same height as the active regions 102A, 102B, which may be accomplished by controlling the etch process for removing layer 103 (FIG. 1d) when a pronounced difference in height level may have been created upon removing the layer 104 (FIG. 1d).

FIG. 1f schematically illustrates the semiconductor device 100 in a further advanced manufacturing stage. As illustrated, a plurality of gate electrode structures 150A, 150B and 150C are formed above the active regions 102A, 102B and above the isolation structure 120. It should be appreciated that the gate electrode structures 150C formed above the isolation structure 120 may be considered as "gate electrode structures" since these structures may typically extend in a direction perpendicular to the drawing plane of FIG. 1f into a further active region and may act as a gate electrode. Similarly, depending on the overall device configuration, the gate electrode structures 150A, 150B formed above the active regions 102A, 102B, respectively, extend above an isolation structure and may extend to a further active region, if required. The gate electrode structures 150A, 150B, 150C may comprise an electrode material 151, such as a silicon material, a silicon/germanium material and the like, possibly in combination with other materials, such as metal-containing materials and the like. Furthermore, a gate insulation layer 152 may be provided, at least in the gate electrode structures 150A, 150B, which separates the electrode material 151 from the underlying active regions 102A, 102B. Depending on the process for forming the gate insulation layer 152, the electrode material 151 may be substantially directly formed on the trench isolation structure 120. In the example shown, it may be assumed that at least a portion of the gate insulation layer 152 may be formed by deposition and may thus also be provided on the trench isolation structure 120 and thus in the gate electrode structures 150C. Furthermore, a dielectric cap material 153, such as a silicon nitride material, may be formed on the electrode material 151. Moreover, as previously explained, the active regions 102A, 102B may represent, in combination with the intermediate trench isolation structure 120, an area for providing P-channel transistors as densely packed circuit elements so that the spacing between neighboring gate electrode structures may be selected in accordance with the overall design rules and may be in the range of approximately 100 nm and less for a gate length of approximately 50 nm and less. It should be appreciated that the gate length of the gate electrode structures 150A, 150B, 150C may be considered as the horizontal extension of the electrode material 151. Consequently, for a given height of the gate electrode structures 150A, 150B, 150C of approximately 80-120 nm, a pronounced aspect ratio, i.e., a ratio of height or depth to width, may be defined which may even be increased during the further processing, as will be explained later on. Moreover, during the further processing, a performance increasing mechanism in the form of an embedded silicon/germanium alloy is to be incorporated into the active regions 102A, 102B, wherein the corresponding process sequence has been identified as a major source for further increasing the aspect ratio for the gate electrode structures 150C formed above the trench isolation structure 120.

In order to incorporate an appropriate strain-inducing semiconductor alloy, such as a silicon/germanium alloy, for P-channel transistors, the gate electrode structures 150A, 150B, 150C in a corresponding P region have to be appropriately protected, while at the same time exposing a significant portion of the active regions 102A, 102B. For this purpose, corresponding offset spacer elements 154, for instance comprised of silicon nitride, are typically formed on sidewalls of the gate electrode structures 150A, 150B, 150C. On the other hand, other device areas, i.e., areas in which N-channel transistors and corresponding isolation structures are provided, may be reliably covered by a silicon nitride layer.

The semiconductor device 100 as illustrated in FIG. 1f may be formed on the basis of the following processes. After completing the trench isolation structure 120 or in any appropriate manufacturing stage prior to forming the structure 120, an appropriate basic dopant concentration may be introduced into the active regions 102A, 102B, such as an N-type doping species, in order to establish the basic transistor characteristics. Next, material for the gate insulation layers 152 and for the electrode material 151 may be formed, for instance, by oxidation, deposition and the like, using well-established process techniques. It should be appreciated that, in sophisticated applications, a high-k dielectric material may be incorporated in the gate insulation layers 152, if required. Thereafter, sophisticated lithography and etch techniques are applied in order to pattern the electrode material 151 and the gate insulation layers 152 in accordance with the design rules. It should be appreciated that the cap material 153 may also be patterned during the corresponding process sequence. Next, a silicon nitride material may be deposited with an appropriate thickness and may be subsequently patterned, thereby forming the offset spacer elements 154, while other device areas may be masked, such as active regions of N-channel transistors and corresponding isolation structures.

FIG. 1g schematically illustrates the semiconductor device 100 in a further advanced manufacturing stage. As shown, cavities 106 are formed in the active regions 102A, 102B, which may be accomplished by performing any appropriate etch process with a high degree of selectivity with respect to silicon dioxide and silicon nitride material. For example, a plurality of plasma-assisted etch recipes are well established in the art for etching silicon material selectively with respect to silicon nitride and silicon dioxide. It should be appreciated that forming the cavities 106 and forming the offset spacer elements 154 may be accomplished in a single etch sequence by appropriately adjusting the etch chemistry upon exposing the active regions 102A, 102B during the etch process for forming the spacer elements 154. It should be appreciated that the size and shape of the cavities 106 may be determined by the width of the offset spacer 154 and by corresponding characteristics of the etch process, since a certain degree of under-etching may be applied, if considered appropriate, which may be accomplished by changing the etch chemistry at any appropriate phase of the etch process and the like.

As is well known, after performing etch processes based on an etch mask and a complex etch chemistry, typically, significant contamination of the device surface may have occurred which may significantly influence the further processing, in particular when critical process steps such as a selective epitaxial growth process has to be performed as a next step. For this reason, efficient cleaning processes may have to be applied, in particular after the cavity etch process, in order to prepare the exposed surface portions for the subsequent selective epitaxial growth process. For instance, very efficient cleaning recipes may be based on hydrofluoric acid, which, however, may also efficiently remove silicon oxide-based materials and may thus contribute to a pronounced material erosion in the isolation structure 120.

FIG. 1h schematically illustrates the semiconductor device 100 when exposed to a reactive process ambient 107, for instance based on HF, in order to clean exposed surface portions. As explained above, a significant material erosion may occur in the isolation structure 120, thereby forming a recess 120A, the final size of which may significantly depend on the parameters and the duration of the cleaning treatment 107. Since a less efficient and thus less aggressive cleaning effect may have a pronounced influence on the subsequently performed selective epitaxial growth process, a compromise has to be found between material erosion, as indicated by the dashed lines, and a desired degree of removal of contaminations for the subsequent epitaxial growth process.

FIG. 1i schematically illustrates the device 100 with a strain-inducing semiconductor alloy, such as a silicon/germanium alloy 108, formed in the active regions 102A, 102B. The semiconductor alloy 108 may be formed by selective epitaxial growth techniques in which process parameters are selected such that material deposition may be substantially restricted to exposed crystalline semiconductor areas, while a material deposition on dielectric surface areas, such as the encapsulated gate electrode structures 150A, 150B, 150C and the trench isolation structure 120 is substantially suppressed.

FIG. 1j schematically illustrates the semiconductor device 100 in a further advanced manufacturing stage in which the offset spacers 154 and the cap material 153 (FIG. 1O are removed, which may be accomplished by well-established selective wet chemical etch recipes, such as hot phosphoric acid and the like. During the removal of these components, a corresponding silicon nitride mask layer may also be removed from other device areas, such as N-channel transistor areas and the like, as previously explained. Based on the configuration as shown in FIG. 1j, the further processing may be continued by completing the basic transistor configuration, for instance, by forming drain and source regions on the basis of an appropriate sidewall spacer structure.

FIG. 1k schematically illustrates the semiconductor device 100 in an advanced manufacturing stage in which transistors 160A, 160B are provided in and above the active regions 102A, 102B. The transistors 160A, 160B comprise drain and source regions 161, the vertical and lateral dopant profile of which may be defined on the basis of a sidewall spacer structure 155. For example, the width 155A of the spacer structures 155 of the transistors 160A, 160B may be used for defining deep drain and source areas in the drain and source regions 161. On the other hand, a width 155C of the spacer structure 155 formed on sidewalls of the gate electrode structures 150C may be increased due to the presence of the recess 120A formed in the trench isolation structure 120 during the previous processing, as discussed above. Consequently, the resulting aspect ratio between the gate electrode structures 150C above the isolation structure 120 may be further increased due to the recess 120A and due to the fact that the effective spacer width 155C may be greater than the effective width between the gate electrode structures 150A and 150C or the gate electrode structures 150B and 150C.

The semiconductor device 100 as illustrated in FIG. 1k may be formed on the basis of the following processes. First, a portion of the spacer structure 155 (not shown), for instance in the form of a moderately thin spacer element, may be provided and corresponding implantation processes may be performed, for instance for forming extension regions, counter-doped regions or halo regions and the like, as may be required for obtaining the complex dopant profile at a channel region 162 of the transistors 160A, 160B. Next, more spacer elements of the spacer structure 155 (not shown) may be formed, depending on the overall complexity of the drain and source regions 161, with corresponding intermediate implantation processes. The spacer elements may be formed by depositing a silicon nitride material, possibly in combination with an etch stop liner, and performing well-established anisotropic etch processes. Consequently, upon depositing the spacer material and etching the same, the different spacer widths 155A, 155C may be generated. After a final anneal process for activating the dopant species and re-crystallizing implantation-induced damage, the further processing may be continued, for instance, by performing a further cleaning process, preparing exposed surface portions for the deposition of a refractory metal, such as nickel and the like. Also in this case, a material loss may be generated in the recess 120A, however, at a lesser degree compared to the previously described cleaning process 107 (FIG. 1h).

FIG. 1l schematically illustrates the semiconductor device 100 with metal silicide regions 163 formed in the drain and source regions 161 of the transistors 160A, 160B. Moreover, metal silicide regions 156 may be formed in the gate electrode structures 150A, 150B, 150C. The metal silicide regions 163, 156 may be formed on the basis of well-established process techniques in which one or more refractory metals, such as nickel, platinum and the like, may be deposited and may be reacted with the semiconductor material in the drain and source regions 161. Furthermore, during the preceding cleaning process, the recess 120A may be further increased, as indicated by the dashed lines.

FIG. 1*m* schematically illustrates the semiconductor device 100 in a further advanced manufacturing stage. As illustrated, a first dielectric material 130 is formed above and between the gate electrode structures 150A, 150B, 150C, which may be provided in the form of a silicon nitride material. Moreover, a further interlayer dielectric material, such as a silicon dioxide material 131, may be formed above the material 130 and may thus form an interface between the device level comprising the transistors 160A, 160B and the gate electrode structures 150C and a metallization system to be formed above the material 131. The layer 130 may also act as an etch stop material for patterning the dielectric material 131, when forming openings therein so as to connect to certain contact regions of the transistors 160A, 160B and also to other active regions, above which also the gate electrode structures 150C may extend, as previously explained. Consequently, the material 130 may have to meet specific requirements with respect to layer thickness and material composition, which may, however, not be compatible with the requirements imposed by the complicated surface topography caused by the recess 120A in the trench isolation structure 120. That is, for a desired layer thickness that is selected so as to obtain reliable filling between the gate electrode structures 150A, 150C, the significantly increased aspect ratio between the gate electrode structures 150C may result in the generation of deposition-related irregularities, such as a void 130A, which may thus extend in a direction perpendicular to the drawing plane of FIG. 1*m*, for instance, the void 130A may extend to active regions. Consequently, during the further processing of the device 100, i.e., forming contact openings in the dielectric materials 131 and 130, the void 130A may be opened and upon filling the contact openings with an appropriate material, such as tungsten, this material may also be deposited within the void 130A and may extend from an active region into the isolation structure 120 and possibly into a further active region, thereby causing a leakage path or even a short circuit between adjacent contact elements provided along a direction perpendicular to the drawing plane of FIG. 1*m*. Consequently, the presence of the void 130A may result in a significant yield loss during the complex patterning process for forming contact elements in the dielectric materials 131 and 130.

The situation may become even more complex when the dielectric material 130 may have to be provided in the form of a highly stressed dielectric material since, in this case, the process parameters may have to be selected on the basis of a significantly reduced range in order to obtain the desired internal stress level upon depositing the material in a desired highly stressed state, such as a highly compressively stressed state. Furthermore, in order to be an efficient strain-inducing mechanism, the thickness of the layer 130 may have to be selected as large as possible, thereby further increasing the probability of creating the void 130A. Consequently, the pronounced surface topography caused by the recess 120A may not be compatible with efficient strain-inducing mechanisms, such as a strained embedded semiconductor alloy and/or a strain-inducing dielectric material, such as the layer 130.

In some conventional approaches, the aspect ratio above the isolation structure 120 may be reduced by, for instance, removing at least a significant portion of the spacer structure 155 prior to the deposition of the material 130. It turns out, however, that a removal or a reduction in size of the spacer structure 155 may have a strong effect on the performance of P-channel transistors and N-channel transistors with a strong correlation to the actually applied device configuration and process strategy. For example, the DC (direct current) characteristics may be significantly affected by a spacer removal, for instance applying stress memorization techniques in N-channel transistors, by providing various strain-inducing mechanisms in P-channel transistors and the like, so that a high degree of transistor variability may be introduced in exchange for improving the deposition conditions during the deposition of the material 130. Consequently, a corresponding approach may be less than desirable.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques in which a superior device geometry may be obtained above trench isolation structures in sophisticated semiconductor devices by incorporating an appropriate etch stop material, which may provide increased etch resistivity, in particular during critical cleaning processes in an early manufacturing stage of the semiconductor device. In some illustrative aspects disclosed herein, the superior etch stop capabilities may be accomplished on the basis of a mask layer stack that may provide enhanced integrity of the underlying insulating material of the trench isolation structure during a sophisticated manufacturing process for forming an embedded strain-inducing semiconductor alloy, thereby enabling the application of sophisticated strain-inducing mechanisms at an early manufacturing stage and also providing the possibility of efficiently depositing an interlayer dielectric material, for instance in the form of a highly stressed material, without requiring the removal or reduction in size of a sidewall spacer structure.

One illustrative semiconductor device disclosed herein comprises a trench isolation structure formed in a semiconductor layer, wherein the trench isolation structure laterally delineates an active region in the semiconductor layer. The semiconductor device further comprises a first gate electrode structure formed on the active region and a second gate electrode structure that is formed above the trench isolation structure. Additionally, the device comprises an etch stop material formed selectively between the trench isolation structure and the second gate electrode structure.

One illustrative method disclosed herein comprises forming an etch stop layer on a trench isolation structure that laterally delineates an active region in a semiconductor layer of a semiconductor device. The method further comprises forming a first gate electrode structure on the active region and performing a cleaning process on the active region while using the etch stop layer so as to suppress material erosion of the trench isolation structure. The method further comprises forming a dielectric layer of an interlayer dielectric material above the active region, the gate electrode structure and the trench isolation structure.

A further illustrative method disclosed herein relates to forming a semiconductor device. The method comprises forming a mask layer stack selectively on a trench isolation structure that laterally delineates an active region in a semiconductor layer. The method further comprises forming a first gate electrode structure on the active region and a second gate electrode structure on the mask layer stack. The method further comprises forming a strain-inducing semiconductor alloy selectively in a portion of the active region, while using the mask layer stack to suppress material erosion in the trench isolation structure.

BRIEF DESCRIPTION OF THE DRAWINGS

The disclosure may be understood by reference to the following description taken in conjunction with the accompanying drawings, in which like reference numerals identify like elements, and in which.

Figure 1A:
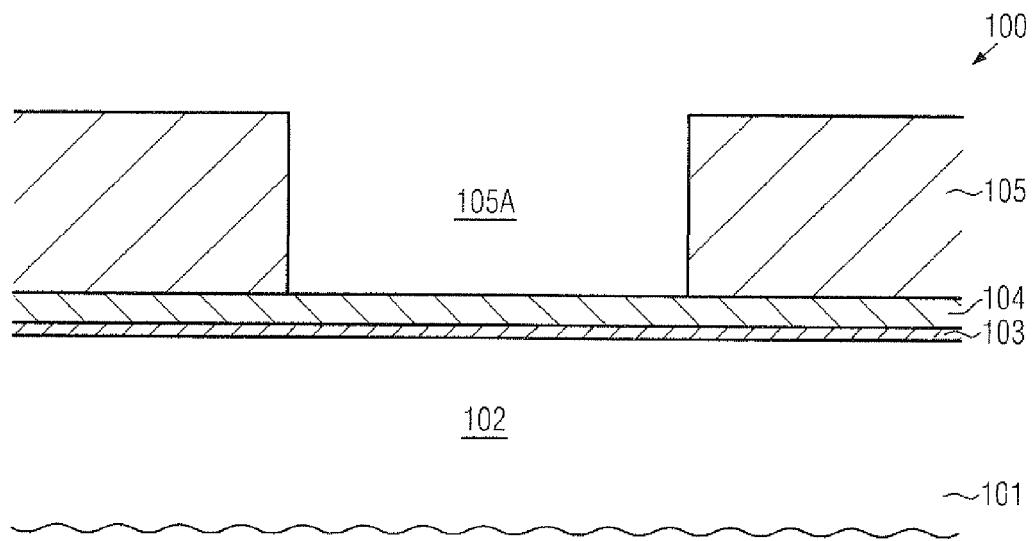
FIGS. 1a-1m schematically illustrate cross-sectional views of a semiconductor device during various manufacturing stages when forming closely spaced gate electrode structures above active regions and trench isolation structures according to conventional process strategies, thereby significantly increasing the probability of creating deposition-related irregularities in the contact level.
Figure 1B:
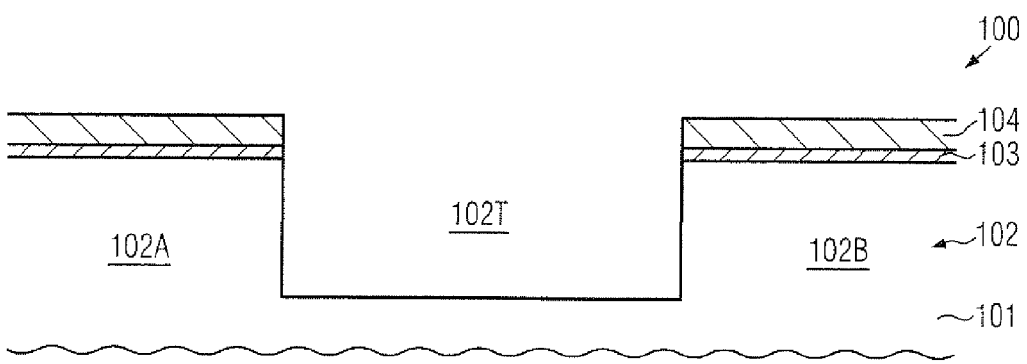
Figure 1C:
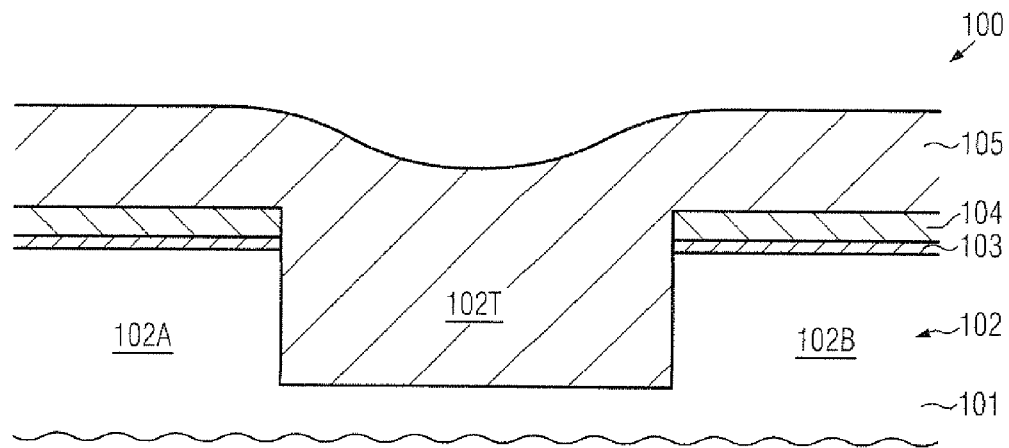
Figure 1D:
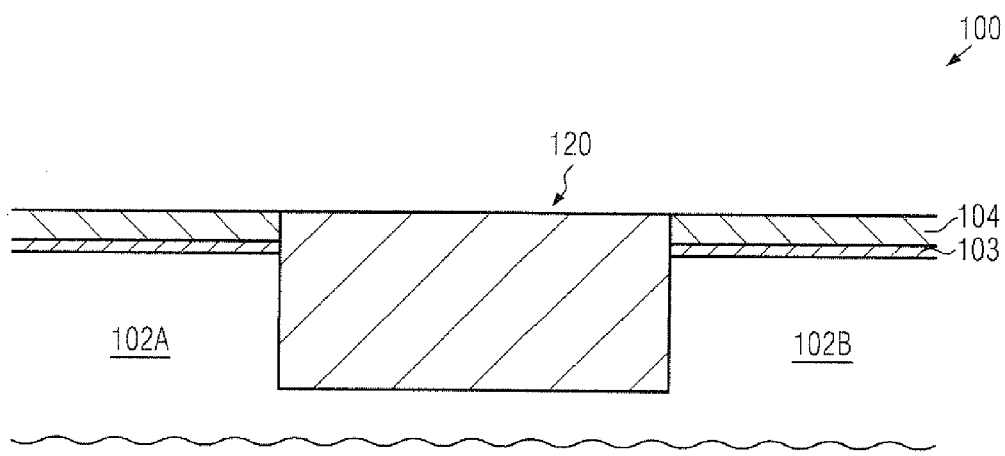
Figure 1E:
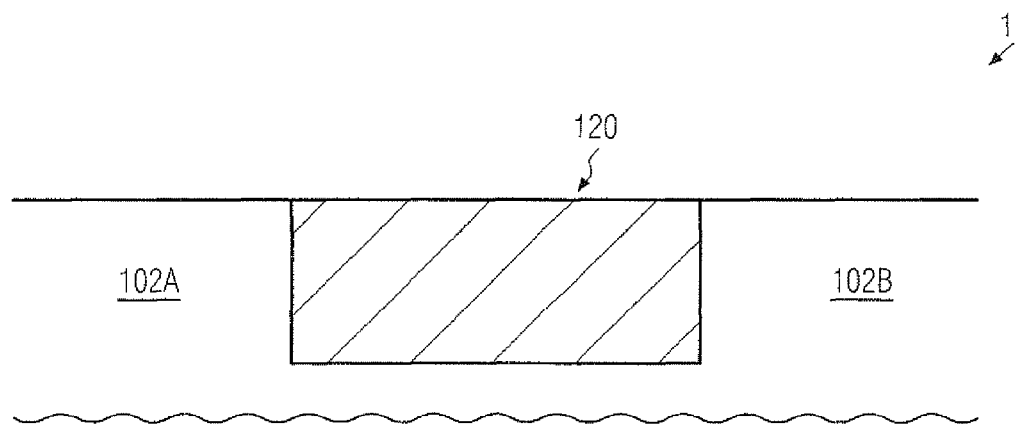
Figure 1F:
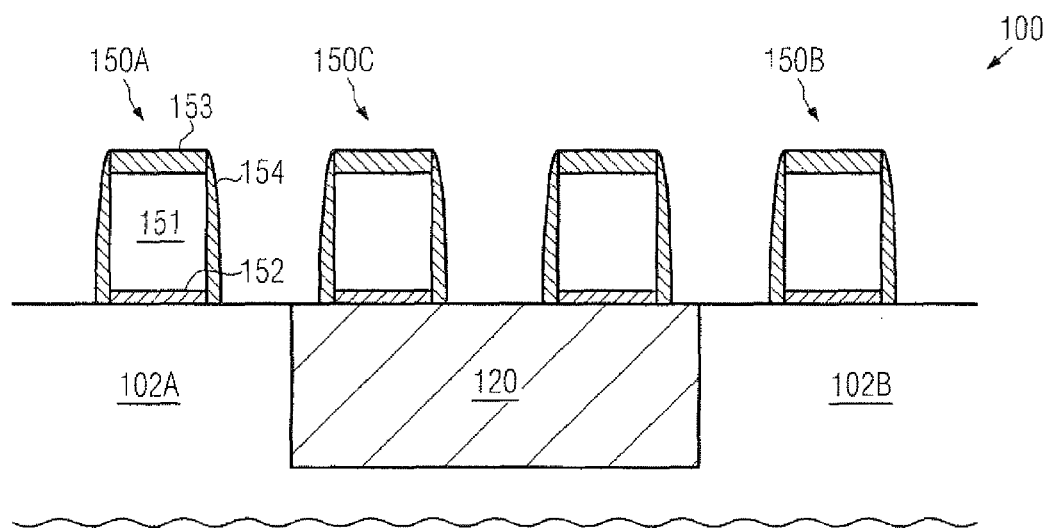
Figure 1G:
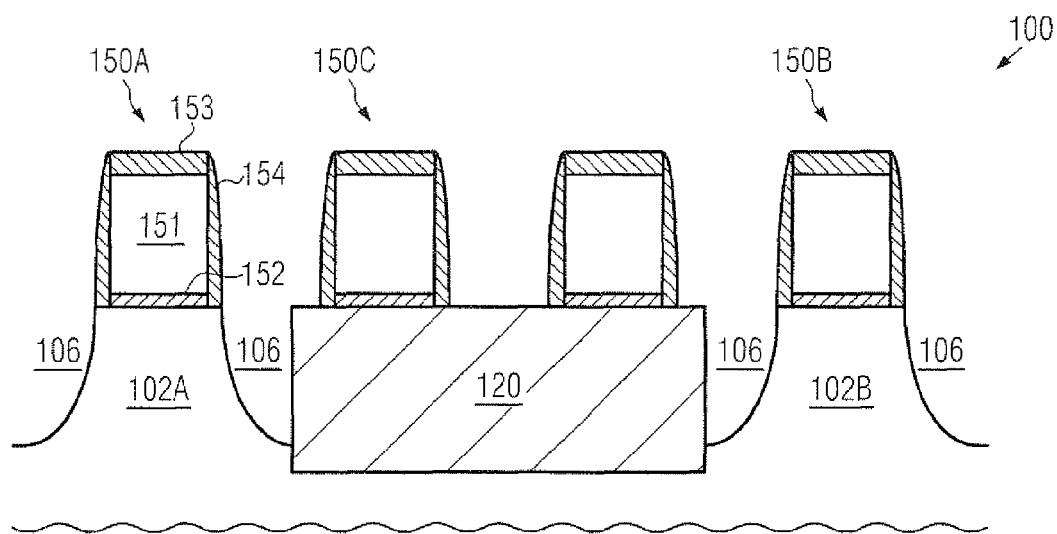

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of deposition-related irregularities created upon depositing an interlayer dielectric material above complex sophisticated topographies of advanced semiconductor devices. It has been recognized that, in particular, the pronounced recessing or material loss of trench isolation structures may result in the creation of voids upon depositing a dielectric material of the contact level above closely spaced gate electrode structures, which may significantly increase the probability of creating leakage paths or short circuits upon forming contact elements. For this reason, the etch resistivity of the trench isolation structure may be improved by incorporating more appropriate materials which reduce material loss, in particular during critical cleaning steps that may be performed on the basis of highly efficient wet chemical etch recipes, for instance based on HF and the like. In some illustrative embodiments, the superior etch resistivity may be obtained on the basis of an appropriate mask layer stack that may provide a reduced degree of material loss during a process sequence for encapsulating gate electrode structures and patterning cavities in active regions of at least one type of transistor, which are subsequently filled with a strain-inducing semiconductor material. Consequently, the mask layer stack may provide etch stop capabilities during the patterning of appropriate spacer materials, while at the same time providing integrity of the basic insulating material of the trench isolation structure during the aggressive cleaning process to be performed prior to the selective epitaxial growth process. For example, a "buried" silicon nitride-based material may be incorporated in the isolation structure, which may thus provide the desired integrity of the underlying silicon dioxide-based material during the cleaning process for removing contaminants prior to the selective epitaxial growth process. On the other hand, a further etch stop material formed above the buried dielectric layer may provide integrity of the buried layer upon patterning a silicon nitride-based spacer material in order to form offset spacer elements for the gate electrode structures, for instance in P-areas of the semiconductor device.

It should be appreciated that the principles disclosed herein may be advantageously applied to semiconductor devices in which strain-inducing mechanisms have to be provided, for instance in the form of an embedded semiconductor alloy, a stressed interlayer dielectric material and the like, since here an increased number of cleaning processes may be required in an early manufacturing stage which, according to the principles disclosed herein, may not result in undue material loss of the isolation structure, thereby providing superior conditions during the deposition of an interlayer dielectric material, which may then be provided in a highly stressed state. In other cases, the superior etch resistivity of the trench isolation structure may also be advantageous for any type of semiconductor devices with reduced spacing between closely spaced gate electrode structures, irrespective of whether additional strain-inducing mechanisms have to be implemented. Consequently, the present disclosure should not be construed as being restricted to any specific device configuration and process strategy in terms of strain-inducing mechanisms, unless such mechanisms are explicitly referred to in specific embodiments and/or the appended claims.

With reference to FIGS. 2a-2j, further illustrative embodiments will now be described in more detail, wherein reference may also be made to FIGS. 1a-1m, if appropriate.

Figure 2A:
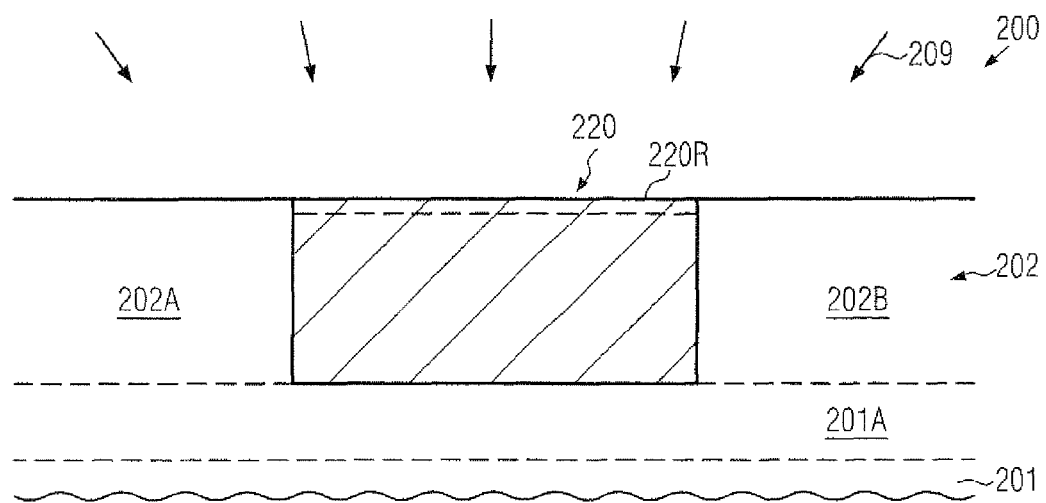
FIGS. 2a-2j schematically illustrate cross-sectional views of a semiconductor device during various manufacturing stages in which superior etch resistivity is imparted to a trench isolation structure in an early manufacturing stage, thereby significantly enhancing the resulting surface topography in a very advanced manufacturing stage when depositing an interlayer dielectric material, according to illustrative embodiments.

FIG. 2a schematically illustrates a cross-sectional view of a semiconductor device 200 in a manufacturing stage in which a trench isolation structure 220 may be formed in a semiconductor layer 202. The semiconductor layer 202 may be formed above any appropriate substrate 201, which may comprise a substantially crystalline substrate material or which may comprise an insulating material layer 201A, depending on the overall device requirements. For example, as previously explained with reference to the semiconductor device 100, the semiconductor layer 202 in combination with the substrate 201 may represent a bulk configuration or an SOI configuration. For example, in the case of the presence of the buried insulating material 201A, the trench isolation structure 220 may extend down to the layer 201A while in other cases the trench isolation structure 220 may extend to any desired depth within a substantially crystalline material of the layer 202. Furthermore, the isolation structure 220 may laterally delineate one or more active regions 202A, 202B, which are to be understood as semiconductor regions in the above-defined sense.

The semiconductor device 200 as shown in FIG. 2a may be formed on the basis of similar process techniques as previously described with reference to FIGS. 1a-1e. Additionally, upon exposing the active regions 202A, 202B, for instance by applying an etch process 209 for removing, for instance, silicon oxide-based materials, as previously discussed, the process parameters may be controlled such that material of the isolation structure 220 may be removed in a controlled manner, thereby forming a recess 220R. As previously discussed, the etch process 209 may be performed on the basis of wet chemical etch recipes and the like, which may have a high selectivity with respect to silicon-based materials of the active regions 202A, 202B. Consequently, these regions may not be unduly affected by a certain degree of over-etch time applied during the etch process 209. For example, the recess 220R may have a depth of several nanometers to several tenths of nanometers, such as approximately 20-60 nm. It should be appreciated, however, that any other appropriate degree of recessing may be selected depending on the further process strategy.

Figure 2B:
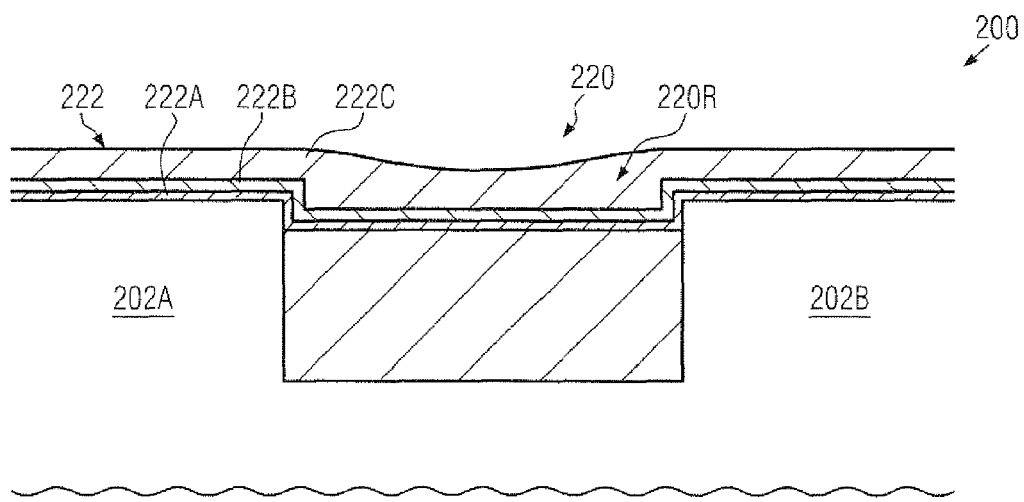

FIG. 2b schematically illustrates the semiconductor device 200 with a mask layer stack 222 formed above the active regions 202A, 202B and within the recess 220R. In one illustrative embodiment, the layer stack 222 may comprise an etch stop material 222A, such as a silicon dioxide-based material, followed by further etch stop material 222B having a different configuration compared to the material 222A, for instance provided in the form of a silicon nitride-based material, or any other material that may have a high etch resistivity with respect to a plurality of wet chemical cleaning recipes, for instance based on HF and the like. For example, the etch stop layer 222B may be comprised of silicon nitride, silicon carbide, nitrogen-containing silicon carbide and the like. Furthermore, a further material layer or cap layer 222C may be formed above the layer 222B and may be comprised of any appropriate material, such as silicon dioxide and the like. The layer stack 222 may be formed on the basis of well-established deposition techniques, such as thermally activated or plasma assisted CVD techniques and the like. For instance, a plurality of deposition recipes for silicon dioxide, silicon nitride and the like are available and may be applied for forming the stack 222.

Figure 2C:
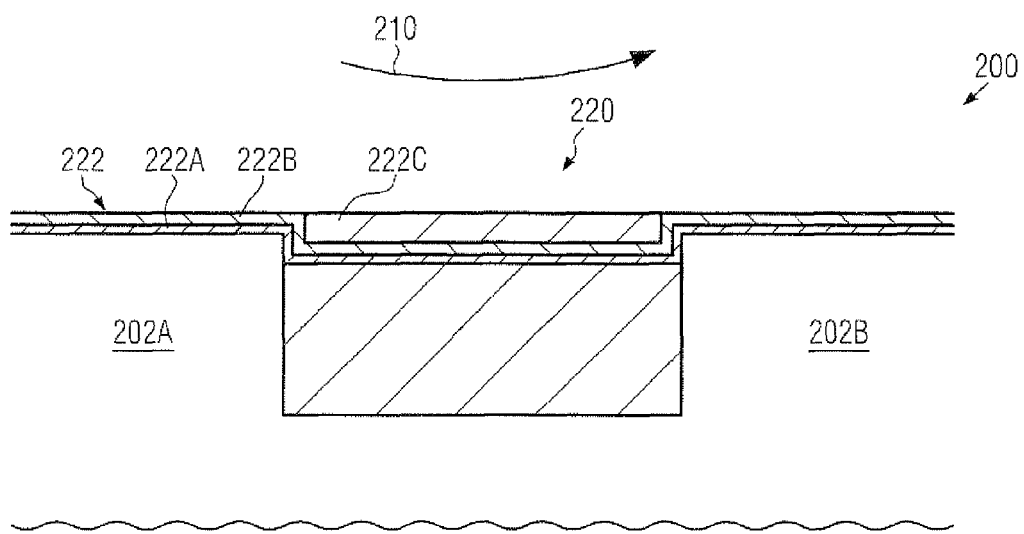

FIG. 2c schematically illustrates the semiconductor device 200 when exposed to a material removal process 210 in order to remove any excess material of the layer 222C. For instance, the removal process 210 may be performed on the basis of a CMP process, wherein the etch stop layer 222B may act as an efficient stop material, while in other cases a CMP process in combination with an etch process may be applied. Consequently, the material 222C may be removed from above the active regions 202A, 202B and may be maintained at least above a significant portion of the isolation structure 220. Thereafter, the materials 222B, 222A may be removed from above the active regions 202A, 202B, for instance by applying well-established etch recipes, such as hot phosphoric acid and the like, for removing the material 222B followed by a further process for exposing the active regions 202A, 202B, which may be accomplished by CMP, etching and the like. If desired, the corresponding removal process, such as CMP or a wet chemical etch process, may be controlled such that a desired high degree of surface planarity may be achieved.

Figure 2D:
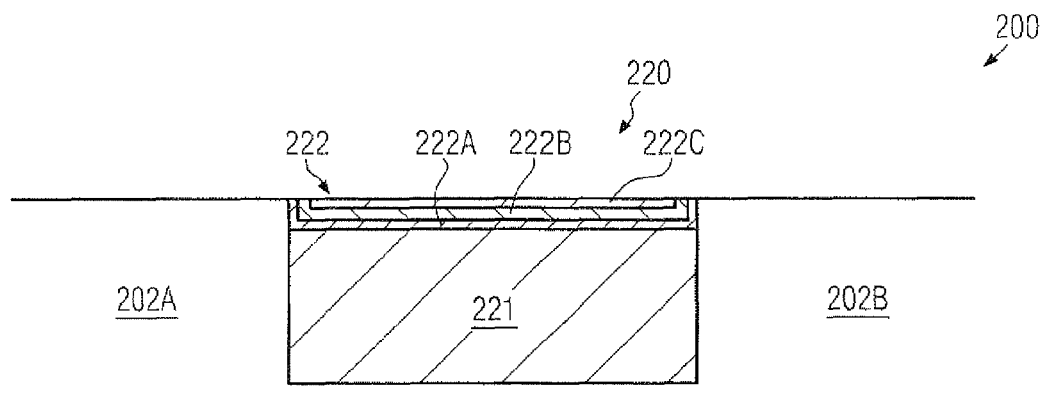

FIG. 2d schematically illustrates the semiconductor device 200 after the above-described process sequence. As illustrated, the device 200 may comprise the trench isolation structure 220 with an initial insulating material 221, such as a silicon dioxide material, in combination with the mask layer stack 222, which has been removed from above the active regions 202A, 202B. Consequently, the layers 222A, 222B and 222C are selectively formed above the insulating material 221, wherein a desired degree of planarity may be accomplished, as discussed above. Based on the configuration as shown in FIG. 2d, the further processing may be continued by any appropriate process strategy, wherein, in some illustrative embodiments, similar process techniques may be applied as previously explained with reference to the semiconductor device 100 when referring to FIGS. 1f and 1g.

Figure 2E:
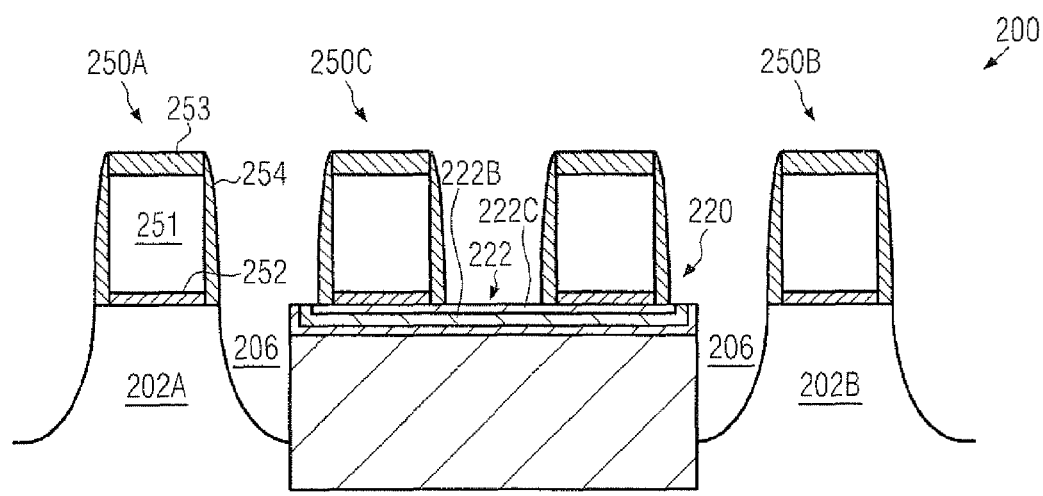

FIG. 2e schematically illustrates the semiconductor device 200 in a further advanced manufacturing stage according to illustrative embodiments in which gate electrode structures 250A, 250B are formed on the active regions 202A, 202B, respectively, and gate electrode structures 250C are formed on the trench isolation structure 220, i.e., on the mask layer stack 222. The gate isolation structures 250A, 250B, 250C may comprise a gate insulation layer 252, an electrode material 251, a cap material 253 and offset spacers 254. For any of these components, the same criteria may apply as previously explained with reference to the device 100. Moreover, in this manufacturing stage, cavities 206 may be provided in the active regions 202A, 202B, which may be accomplished on the basis of any appropriate etch strategy, as is also previously discussed with reference to the device 100. For example, the spacer elements 254 may be formed by depositing a spacer material, such as a silicon nitride material, and etching the same on the basis of any appropriate anisotropic etch recipe, wherein, in the embodiment shown, the cap material 222C of the layer stack 222 may preserve the integrity of the etch stop material 222B, even if comprised of substantially the same material as the spacer elements 254. Consequently, undue material loss of the layer stack 222 may be avoided. Thereafter, a further etch step or a separate etch process may be applied in which material of the active regions 202A, 202B may be removed with a high degree of selectivity to dielectric materials, such as silicon dioxide, silicon nitride and the like, as is also previously explained.

Figure 1H:
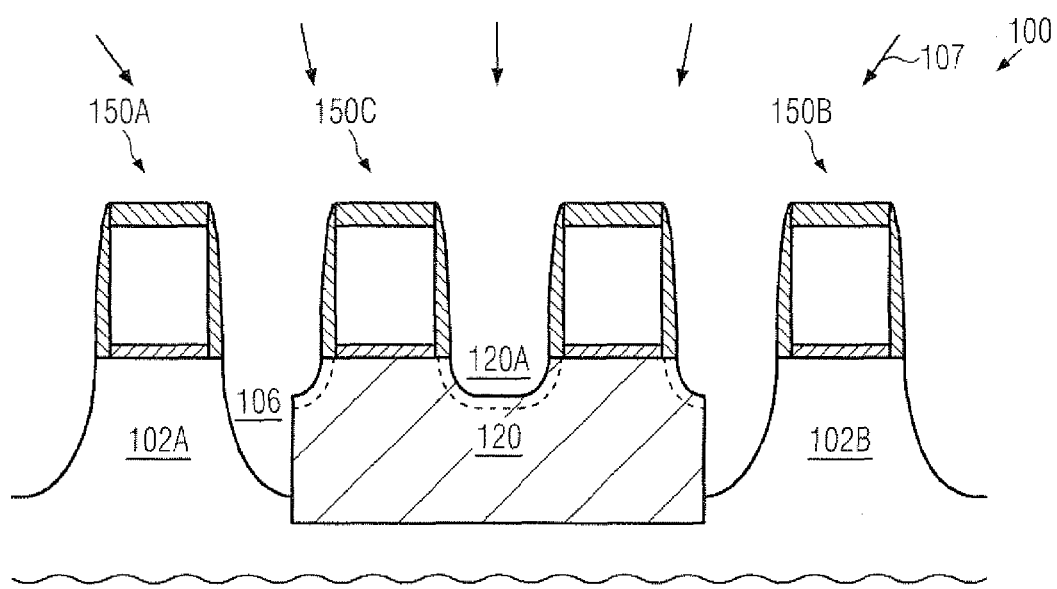
Figure 1I:
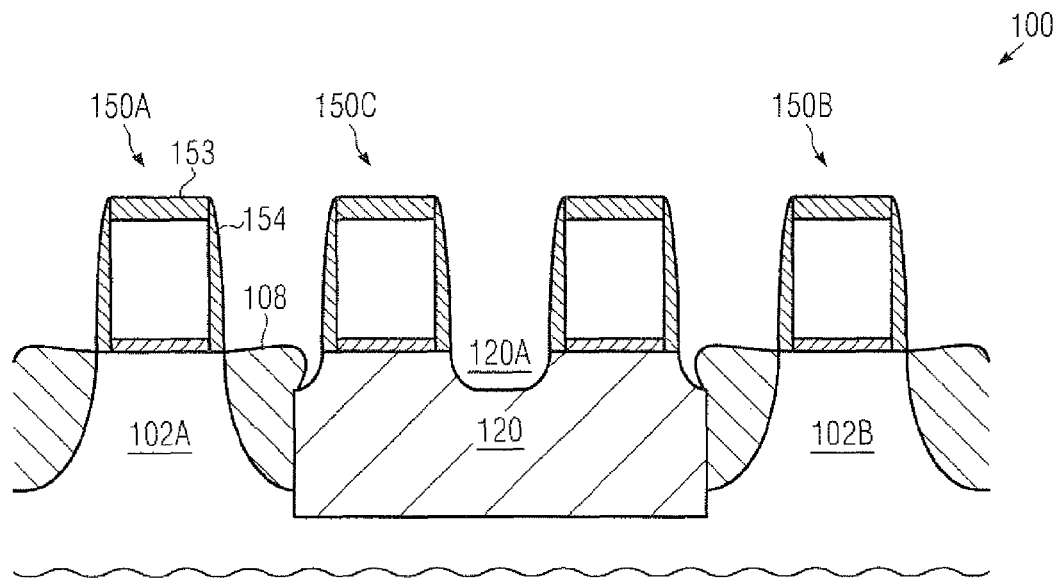
Figure 2F:
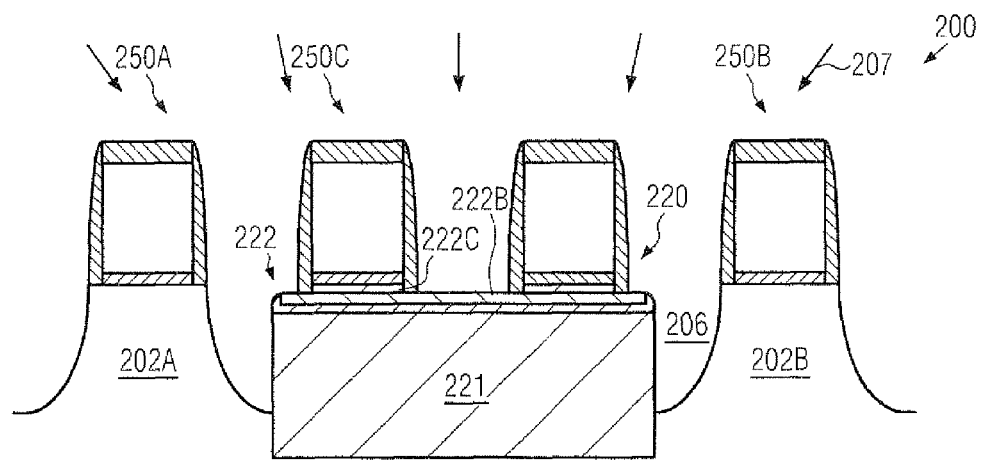

FIG. 2f schematically illustrates the semiconductor device 200 when exposed to a reactive process ambient 207, which may be configured to efficiently remove contaminants and the like. As previously discussed, frequently, efficient cleaning recipes may comprise silicon dioxide removing agents, such as HF and the like, which may result in undue material erosion of a conventional isolation structure, as is, for example, explained with reference to FIG. 1h. According to the principles disclosed herein, the mask layer stack 222 and in particular the etch stop layer 222B may suppress undue material loss of the initial insulating material 221 since the material 222B may have a high etch resistivity with respect to the ambient 207. For example, silicon nitride-based materials may exhibit a high etch resistivity with respect to HF-based wet chemical recipes. Thus, during the process 207, exposed portions of the layer 222C may be removed, which, however, may not result in a pronounced increase of the aspect ratio between the gate electrode structures 250C due to the reduced initial thickness of the layer 222C. Consequently, the further processing of the device 200 may be continued on the basis of a less pronounced surface topography compared to conventional devices (FIG. 1h).

Figure 2G:
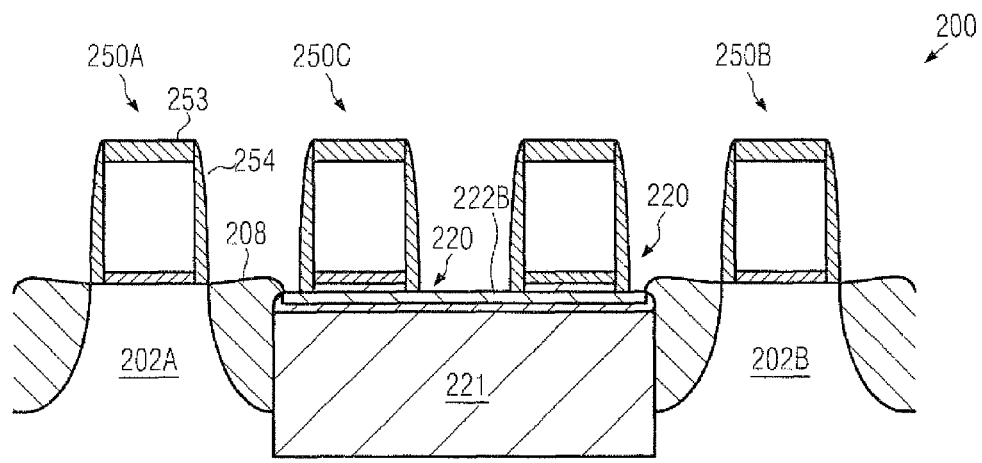

FIG. 2g schematically illustrates the device 200 with a strain-inducing semiconductor alloy 208 formed in the active regions 202A, 202B. The semiconductor alloy 208 may be provided in the form of any appropriate material composition, such as a silicon/germanium alloy, a silicon/tin alloy, a silicon/germanium/tin alloy, when a high compressive strain component is required. In other cases, silicon/carbon material mixtures may be used in order to create a tensile strain component. It should be appreciated that two different material compositions may be provided for different types of transistors, such as P-channel transistors and N-channel transistors, wherein, typically, a corresponding isolation structure, such as the structure 220, may be exposed to a cleaning process, such as the process 207 (FIG. 2f) at least once. Consequently, the material 222B may efficiently preserve integrity of the insulating material 221, irrespective of the process strategy applied. Furthermore, with respect to any characteristics of a selective epitaxial growth process, it is referred to corresponding explanations provided with reference to FIG. 1i.

Figure 1J:
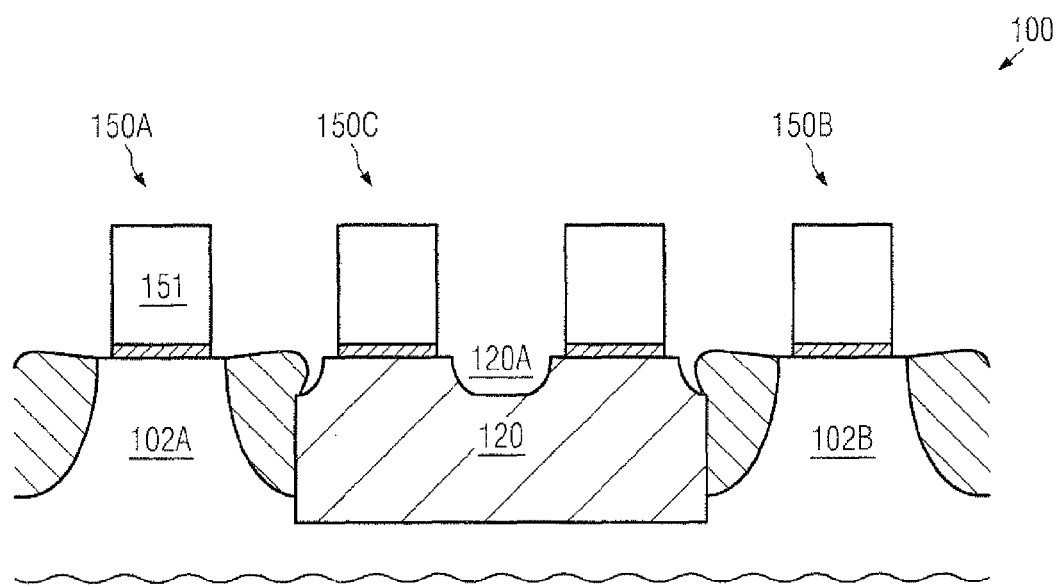
Figure 1K:
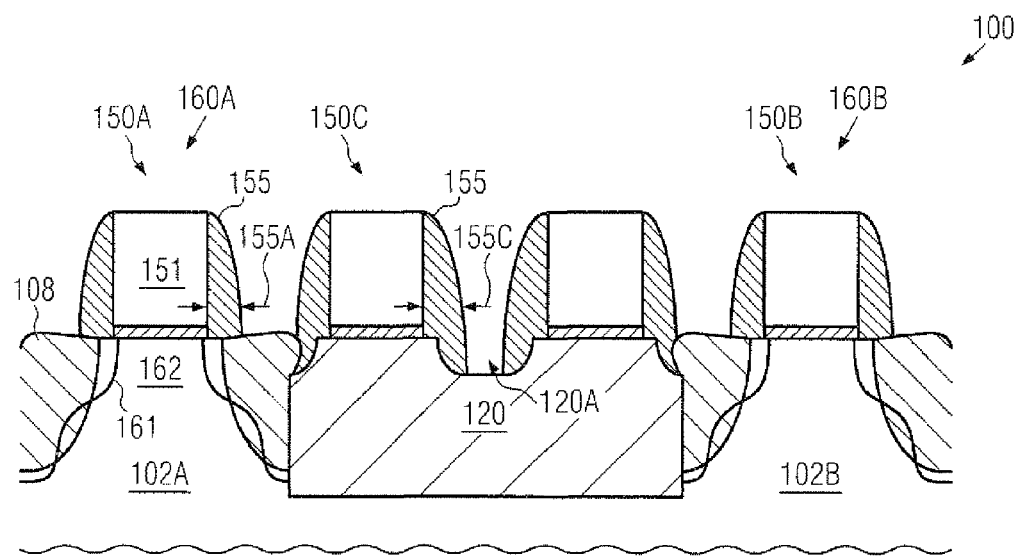
Figure 1L:
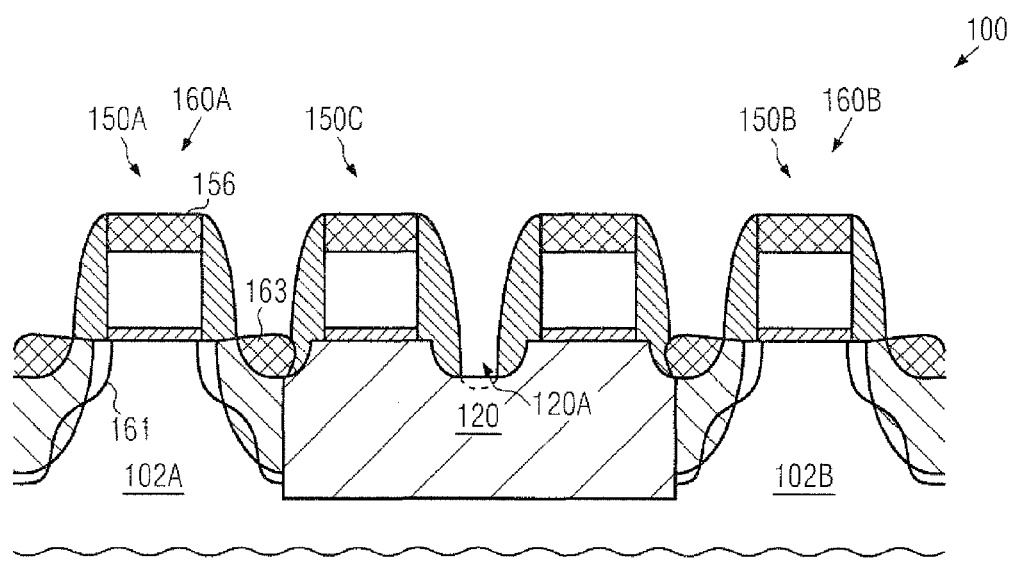
Figure 1M:
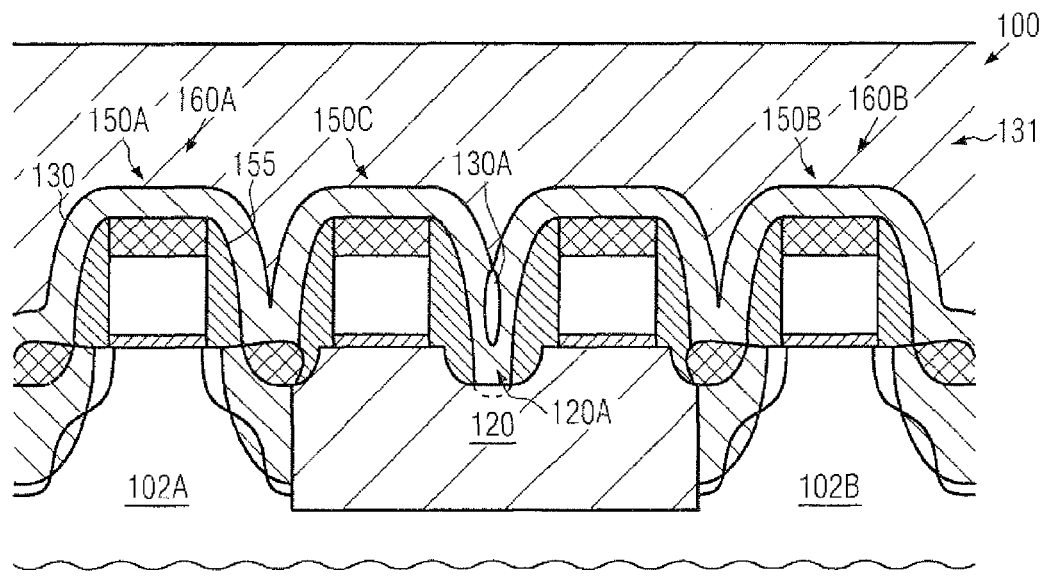
Figure 2H:
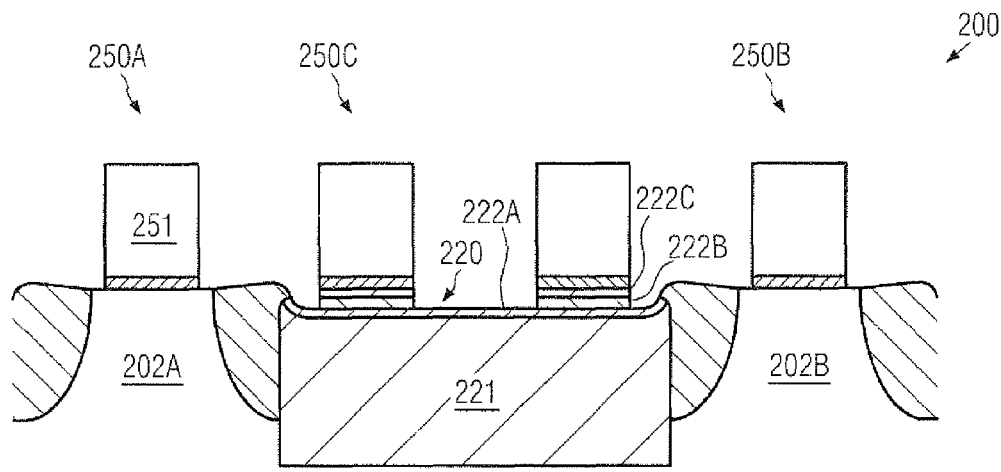

FIG. 2h schematically illustrates the semiconductor device 200 after the removal of the cap layer 253 and the spacers 254 (FIG. 2g), while exposed portions of the etch stop layer 222B may also be removed. For this purpose, any appropriate etch process may be applied, as is also previously explained with reference to FIG. 1j. Consequently, the electrode material 251 may be exposed and the gate electrode structures 250C may be formed above a layer stack comprising the residues of the layers 222C, 222B and 222A. Due to the moderately small initial thickness of these layers, the resulting increased aspect ratio of the gate electrode structures 250C compared to the gate electrode structures 250A and 250B is still significantly less compared to the conventional devices (FIG. 1j).

Figure 2I:
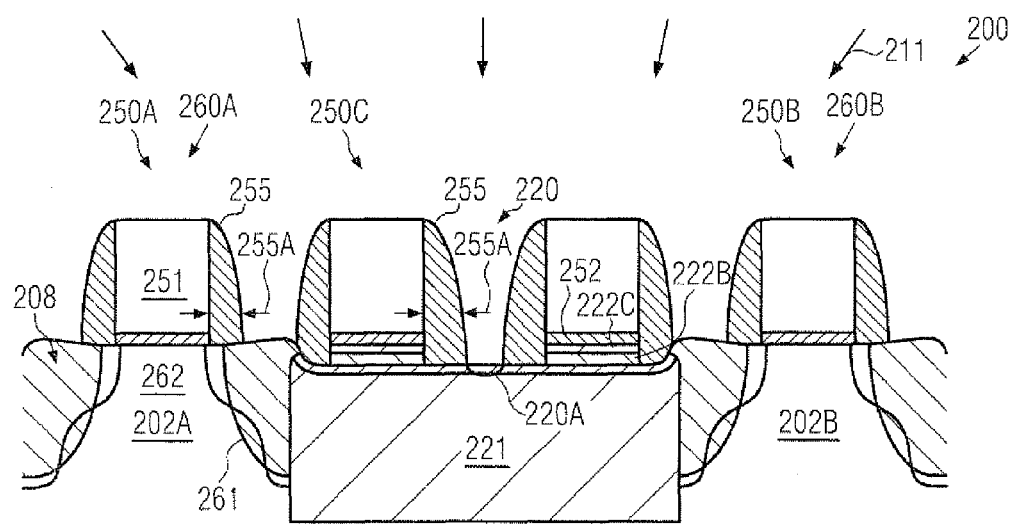

FIG. 2i schematically illustrates the semiconductor device 200 in a further advanced manufacturing stage in which transistors 260A, 260B are formed in and above the active regions 202A, 202B, respectively. Hence, drain and source regions 261 may be formed in the active regions 202A, 202B in combination with corresponding channel regions 262, the strain conditions of which may be influenced by the material 208. Moreover, the gate electrode structures 250A, 250B, 250C may comprise a sidewall spacer structure 255, the width 255A of which may be similar for the gate electrode structures 250A, 250B on the one hand and the gate electrode structures 250C on the other hand, due to a similar height level of the isolation structure 220 and the active regions 202A, 202B.

With respect to any manufacturing techniques for forming the drain and source regions 261 and the spacer structure 255, it may be referred to the semiconductor device 100. Furthermore, the device 200 may be exposed to a further cleaning process 211, which may contribute to a certain degree of material loss in the isolation structure 220, as indicated by 220A, which, however, may be significantly less compared to any material erosion in preceding manufacturing stages, as explained with reference to the semiconductor device 100. During the process 211, exposed surface areas may be prepared for the deposition of any appropriate metal species, such as nickel, platinum and the like. Thereafter, metal silicide regions may be formed, as is also previously described.

Figure 2J:
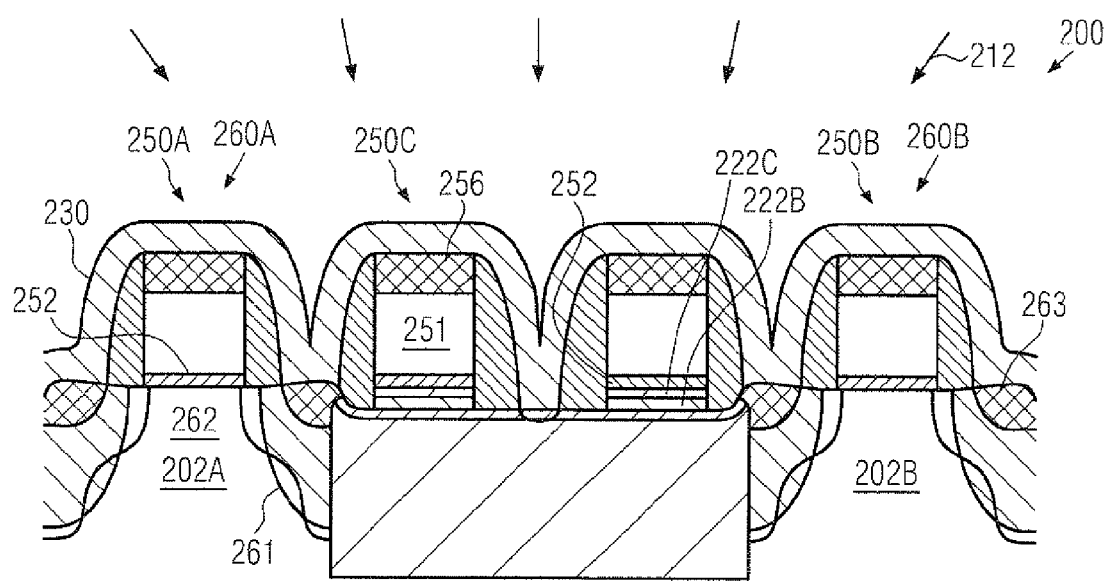

FIG. 2j schematically illustrates the semiconductor device 200 in a further advanced manufacturing stage. As illustrated, metal silicide regions 263 may be formed in a portion of the drain and source regions 261 and, depending on the overall configuration of the gate electrode structures 250A, 250B, 250C, metal silicide regions 256 may be formed in a portion of the electrode material 251. It should be appreciated, however, that the gate electrode structures 250A, 250B, 250C may have any other configuration, for instance the metal silicide regions 256 may not be formed in the electrode material 251, for instance when a cap material may still be present so as to enable a removal of at least a portion of the material 251 in a further advanced manufacturing stage. Moreover, as previously discussed, the electrode material 251 of the gate electrode structures 250C may be directly formed on the remaining portion of the layer 222C if the initial gate insulation material 251 may be formed on the basis of an oxidation process. In other cases, as illustrated in FIG. 2j, the layer 251 may be provided as a deposited material and may thus be formed on the layer 222C, which in turn may still be formed on a portion of the layer 222B. On the other hand, the gate insulation layers 252 of the gate electrode structures 250A, 250B may be directly formed on the active regions 202A, 202B. Furthermore, the gate insulation materials may comprise any appropriate material composition, such as high-k dielectric materials, possibly in combination with any work function adjusting metal species, depending on the device requirements and the process strategy to be applied for forming sophisticated high-k metal gate electrodes.

Furthermore, the device 200 may be exposed to a deposition ambient 212, during which a portion of an interlayer dielectric material, indicated as a dielectric layer 230, may be deposited so as to obtain desired material characteristics for the layer 230. Due to the superior surface topography compared to conventional devices (FIG. 1m), the layer 230 may be deposited in a substantially void-free manner, in particular between the gate electrode structures 250C, thereby significantly reducing the probability of creating leakage paths or short circuits in the contact level of the device 200, as previously explained. In some illustrative embodiments, the dielectric material 230 may be provided as a stressed dielectric material so as to impart a further strain component to the channel regions 262 of the transistors 260A, 260B. It should be appreciated that, in other device areas, the material 230 may be provided with a different type of intrinsic stress, if considered appropriate. Thereafter, the further processing may be continued by depositing a further portion of the interlayer dielectric material and patterning the same so as to form contact openings, which may connect to one or more of the gate electrode structures 250A, 250B, 250C and to one or more of the active regions 202A, 202B. The contact openings may then be filled with any appropriate conductive material in accordance with an appropriate process technique, wherein the probability of depositing conductive material into deposition-related irregularities may be significantly reduced.

As a result, the present disclosure provides semiconductor devices and manufacturing techniques in which a significantly less demanding surface topography may be achieved upon depositing an interlayer dielectric material above densely packed gate electrode structures formed above a trench isolation structure, which may be accomplished by endowing the isolation structure with superior etch resistivity with respect to efficient cleaning recipes, which may contribute to significant material erosion in conventional strategies. For instance, the significant material erosion during a cleaning process for performing a selective epitaxial growth process may be significantly reduced, which has been identified as a major source for causing contact failures in sophisticated semiconductor devices. In other cases, the superior etch resistivity of the trench isolation structures may provide superior integrity for any type of process strategy in which densely packed gate electrode structures are to be formed above an isolation structure, even if additional strain-inducing mechanisms are not to be implemented. Consequently, the superior integrity of the trench isolation structures may provide superior deposition conditions during the deposition of the interlayer dielectric material without requiring the removal of a sidewall spacer structure, which may conventionally be associated with significant performance deterioration, wherein a pronounced correlation between the process strategy under consideration and the resulting transistor characteristics may be observed. Consequently, by increasing the etch resistivity of the trench isolation structure in an early manufacturing stage, a high degree of compatibility with conventional strategies may be maintained, as is, for instance, described with reference to the conventional semiconductor device 100, while complex additional processes for removing or reducing the size of a sidewall spacer structure may be avoided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an etch stop layer on a trench isolation structure, said trench isolation structure laterally delineating an active region in a semiconductor layer of a semiconductor device, wherein forming said etch stop layer comprises forming a recess in an insulating material of said trench isolation structure, depositing said etch stop layer in said recess and selectively removing said etch stop layer from said active region;
    forming a first gate electrode structure on said active region;
    performing a cleaning process on said active region while using said etch stop layer so as to suppress material erosion of said trench isolation structure; and
    forming a dielectric layer of an interlayer dielectric material above said active region, said gate electrode structure and said trench isolation structure.

2. The method of claim 1, further comprising forming a cap layer on said etch stop layer.

3. The method of claim 2, further comprising forming a cavity in said active region by performing an etch process and using said cap layer as an etch stop material.

4. The method of claim 3, wherein said cleaning process is performed after forming said cavity so as to prepare said active region for forming a strain-inducing semiconductor alloy selectively in said cavity.

5. The method of claim 1, further comprising forming an offset spacer structure on sidewalls of said gate electrode structure prior to performing said cleaning process and removing said offset spacer structure and a portion of said etch stop layer in a common etch process.

6. The method of claim 5, further comprising forming drain and source regions in said active region after removing said offset spacer structure.

7. The method of claim 6, wherein forming said drain and source regions comprises forming a sidewall spacer structure with a predefined spacer width on said gate electrode structure and using said gate electrode structure comprising said sidewall spacer structure as an implantation mask.

8. The method of claim 7, further comprising forming metal silicide regions in said drain and source regions by using said sidewall spacer structure having said predefined spacer width as a mask.

9. The method of claim 8, wherein said dielectric layer is formed above said gate electrode structure comprising said sidewall spacer structure having said predefined spacer width.

10. The method of claim 1, further comprising forming a second gate electrode structure above said trench isolation structure, wherein said gate electrode structure and said second gate electrode structure are formed with a gate length of 50 nm or less.

11. The method of claim 6, wherein said drain and source regions are P-type doped regions.

12. A method of forming a semiconductor device, the method comprising:
    forming a mask layer stack selectively on a trench isolation structure, said trench isolation structure laterally delineating an active region in a semiconductor layer, wherein forming said mask layer stack comprises forming a recess in said trench isolation structure, depositing two or more material layers above said active region and in said recess and removing said two or more material layers selectively from said active region;
    forming a first gate electrode structure on said active region and a second gate electrode structure on said mask layer stack; and
    forming a strain-inducing semiconductor alloy selectively in a portion of said active region, while using said mask layer stack so as to suppress material erosion in said trench isolation structure.

13. The method of claim 12, wherein depositing said two or more material layers comprises depositing a first dielectric layer having a high etch resistivity with respect to a cleaning process performed so as to form said strain-inducing semiconductor alloy, and depositing a second dielectric layer above said first dielectric layer.

14. The method of claim 13, wherein said first dielectric layer comprises silicon nitride and said second dielectric layer comprises silicon dioxide.

15. The method of claim 12, further comprising forming drain and source regions in said active region on the basis of a sidewall spacer structure having a predefined spacer width and forming a dielectric material layer above said first and second gate electrode structures that comprise said sidewall spacer structure having said predefined spacer width.

16. The method of claim 15, wherein said dielectric material layer is provided with an intrinsic stress level so as to induce a strain component in said active region.

* * * * *